US009188783B2

(12) United States Patent
Papas et al.

(10) Patent No.: US 9,188,783 B2
(45) Date of Patent: Nov. 17, 2015

(54) REFLECTIVE AND REFRACTIVE SURFACES CONFIGURED TO PROJECT DESIRED CAUSTIC PATTERN

(75) Inventors: Marios Papas, Zürich (CH); Wojciech Jarosz, Zürich (CH); Wenzel A. Jakob, Karlsruhe (DE); Szymon M. Rusinkiewicz, Princeton, NJ (US); Wojciech Matusik, Lexington, MA (US); Tim A. Weyrich, London (GB)

(73) Assignee: Disney Enterprises, Inc., Burbank, CA (US)

(*) Notice: Subject to any disclaimer, the term of this patent is extended or adjusted under 35 U.S.C. 154(b) by 895 days.

(21) Appl. No.: 13/229,321

(22) Filed: Sep. 9, 2011

(65) Prior Publication Data
US 2013/0066596 A1    Mar. 14, 2013

(51) Int. Cl.
G06F 17/50    (2006.01)
G02B 27/09    (2006.01)
G02B 3/00    (2006.01)
G02B 27/00    (2006.01)

(52) U.S. Cl.
CPC .......... *G02B 27/0927* (2013.01); *G02B 3/0043* (2013.01); *G02B 27/0012* (2013.01); *G06F 17/50* (2013.01)

(58) Field of Classification Search
CPC ............ G06F 17/5018; G06F 2217/16; G06F 17/5009; G06F 17/50; G06T 5/006; G06T 11/003; G06T 11/005; G06T 11/006; G02B 27/0927; G02B 27/0012; G02B 3/0043
USPC ............ 703/5, 1; 359/292, 619; 345/423, 596
See application file for complete search history.

(56) References Cited

U.S. PATENT DOCUMENTS

2008/0049019 A1* 2/2008 Keller .......................... 345/426

OTHER PUBLICATIONS

Papas, Marios et al., "Goal-Based Caustics", Apr. 2011, Computer Graphics Forum, vol. 30, Issue 2, The Eurographics Association and Blackwell Publishing, Ltd.*
Jakob, Wenzel et al., "Progressive Expectation-Maximization for Hierarchical Volumetric Photon Mapping", Jul. 19, 2011, Computer Graphics Forum, vol. 30, Issue 4.*
Alexandrov, A.N. et al., "Caustic Crossing Events and Source Models in Gravitational Lens Systems", Apr. 30, 2011, Ukr. J. Phys. vol. 56, No. 4.*
McAllister, David Kirk, "A Generalized Surface Appearance Representation for Computer Graphics", 2002, University of North Carolina at Chapel Hill.*
Shealy, David L., "Wavefront and Caustic Surfaces of Refractive Laser Beam Shaper", 2007, Novel Optical Systems Design and Optimization X, Proc. of SPIE, vol. 6668, 666805.*

(Continued)

*Primary Examiner* — Kamini S Shah
*Assistant Examiner* — Cedric D Johnson
(74) *Attorney, Agent, or Firm* — Patterson & Sheridan, LLP

(57) ABSTRACT

Techniques are described for designing and manufacturing a surface that produces a desired image when illuminated by a light source. As described, the desired image may be decomposed into a collection of Gaussian kernels (referred to as Gaussians). A shape of a micropatch lens corresponding to each Gaussian may be determined, and the resulting micropatch lenses may be assembled to form a highly continuous surface that will cast an approximation of the desired image formed form the sum of a plurality of Gaussian caustics. The disclosed techniques may be used to create a design for a light-redirecting surface amenable to milling (or other manufacturing process).

12 Claims, 9 Drawing Sheets

(56) References Cited

OTHER PUBLICATIONS

Weyrich, Tim et al., "Fabricating Microgeometry for Custom Surface Reflectance", 2009, ACM Transactions on Graphics (TOG), vol. 28, No. 3.*

Shah, Musawir A. et al., "Caustic Mapping: An Image-Space Technique for Real-Time Caustics", Mar.-Apr. 2007, IEEE Transactiions on Visualization and Computer Graphics, vol. 13, No. 2, IEEE.*

Olano, Marc et al., "Normal Distribution Mapping", 1997, University of North Carolina Computer Science Technical Report 97.*

Michael Balzer et al., "Capacity-Constrained Point Distributions: A Variant of Lloyd's Method," ACM Transactions on Graphics (TOG), Proceedings of ACM SIGGRAPH 2009, Aug. 2009, vol. 28(3): pp. 86:1-86:8.

Tim Weyrich et al., "Fabricating microgeometry for custom surface reflectance," ACM Transactions on Graphics (TOG), Proceedings of ACM SIGGRAPH 2009, Aug. 2009, vol. 28(3): pp. 32:1-32:6.

Peter Shirley et al., "A low distortion map between disk and square," Journal of Graphics Tools, 1997, vol. 2(3): pp. 45-52.

Bruce Walter et al., "Single Scattering in Refractive Media with Triangle Mesh Boundaries," ACM Transactions on Graphics (TOG), Proceedings of ACM SIGGRAPH 2009, Aug. 2009, vol. 28(3): pp. 92:1-92:7.

* cited by examiner

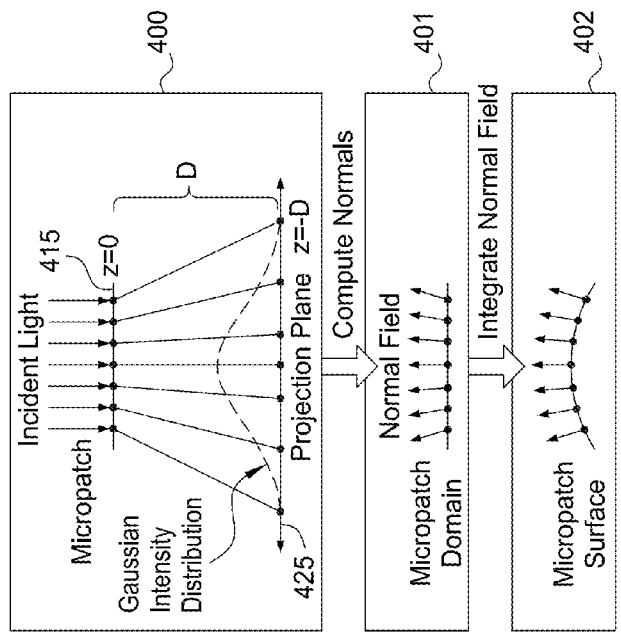
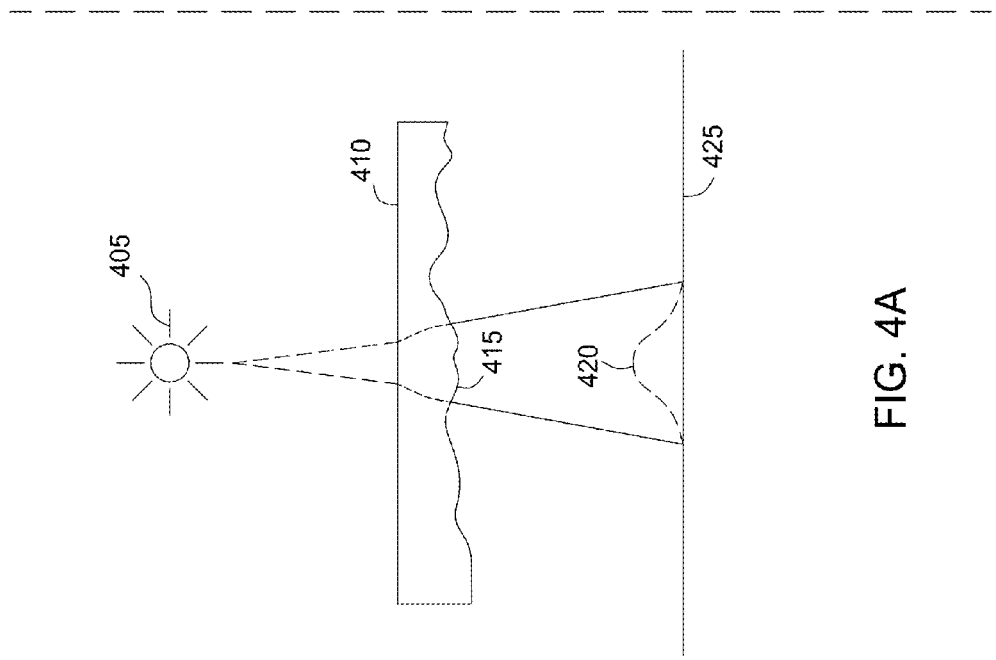
FIG. 4B
FIG. 4A

REFLECTIVE AND REFRACTIVE SURFACES CONFIGURED TO PROJECT DESIRED CAUSTIC PATTERN

BACKGROUND

1. Field of the Invention

The present invention generally relates to a translucent surface (such as a milled acrylic plate) that projects a desired image when light passes through it, as well as to techniques for designing such a surface. More specifically, the present invention relates to techniques for determining a surface pattern that will cast caustics which generate a recognizable image on a projection surface.

2. Description of the Related Art

In optics, a caustic refers to an envelope of light rays reflected or refracted by a curved surface, as well as to the projection of such light rays onto another surface. More specially, a caustic is the curve or surface tangent to each light ray, defining a boundary of an envelope of rays as a curve of concentrated light. For example, light passing through the curved surface of a wine glass creates a cusp-like pattern on a table which the wine glass is resting. Note, caustics are different from projecting light through a slide, as light is redirected (whether reflected or refracted) rather than absorbed, maintaining higher light levels and contrast.

One known application of reflective caustic design is luminaire design—the creation of lamp reflectors that create a desired radiance distribution for a given light source position. Other applications include e.g., in architecture (pattern glass that casts attractive caustics into a room) or designing security features which create hard-to-forge artifacts that can be "read out" under normal light.

SUMMARY

Embodiments of the invention provide a translucent surface configuration with a plurality of micropatches. Each micropatch provides a lens configured to create a caustic on a projection surface when light passes through the translucent surface. The lens may be a refractive or reflective lens. Collectively, each individual caustic sums to form an approximation of selected image. Further, each Gaussian caustic may distribute the relatively same amount of light energy to the projection surface. In a particular embodiment, the plurality of micropatch lenses on the translucent surface is arranged as a substantially continuous surface created by milling a substantially planar face of the translucent surface.

Another embodiment of the invention includes a method for designing a translucent surface. The method may generally include decomposing an input image into a plurality of Gaussian kernel functions. For each of a plurality of micropatch lenses on the translucent surface being designed, a mapping between a plurality of points on a micropatch domain and corresponding points on a projection surface is determined such that an intensity of light energy distributed by the mapping corresponds to one of the Gaussian kernel functions. Additionally, from the mapping, a surface topology is determined for each micropatch lens that will cast a Gaussian caustic corresponding to one of the Gaussian kernel functions. This method may also include determining an arrangement of the micropatch lenses on the translucent surface, wherein the Gaussian caustics cast by the plurality of arranged micropatch lenses sum to form an approximation of the input image.

BRIEF DESCRIPTION OF THE DRAWINGS

So that the manner in which the above recited aspects are attained and can be understood in detail, a more particular description of embodiments of the invention, briefly summarized above, may be had by reference to the appended drawings.

It is to be noted, however, that the appended drawings illustrate only typical embodiments of this invention and are therefore not to be considered limiting of its scope, for the invention may admit to other equally effective embodiments.

FIG. 4A illustrates an example of a refractive micropatch, according to one embodiment of the invention.

FIG. 4B illustrates a process for determining a lens shape configured to generate a desired anisotropic Gaussian caustic on a projection surface, according to one embodiment of the invention.

DETAILED DESCRIPTION

Figure 1B:
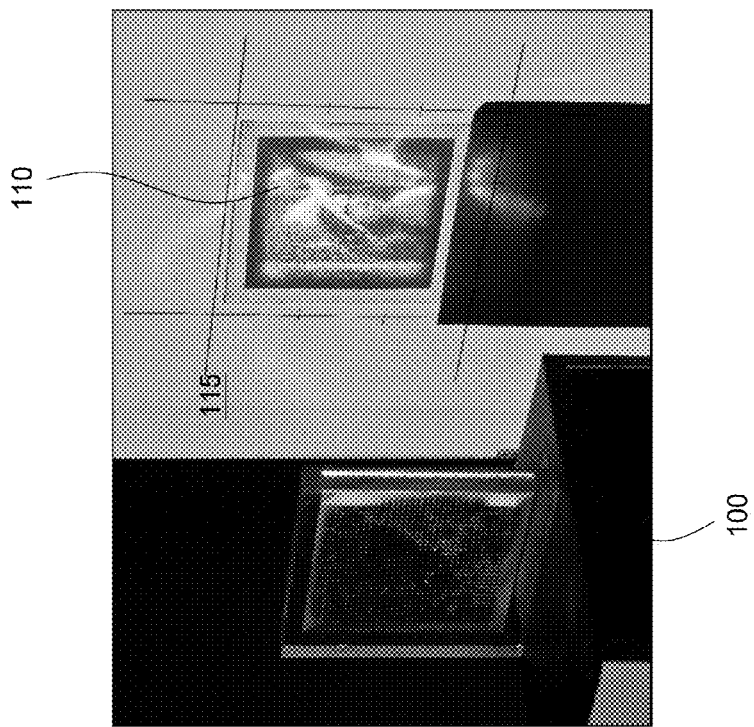
FIG. 1B is a block diagram illustrating an example of an image created as a result of light being redirected by the surface 100, according to one embodiment of the invention.

Embodiments of the invention provide techniques for designing and manufacturing a surface that produces a desired image when illuminated by a light source. This allows, e.g., a translucent object to be designed and manufactured that projects a custom image on a projection plane when lit by direct light. In one embodiment, a non-negative image decomposition is created for an input image. The decomposition defines a set of (possibly overlapping) anisotropic Gaussian kernels. From this decomposition, a surface consisting of an array of continuous surface elements is generated. Each smooth surface element (referred to as a micropatch) provides a lens (or mirror) which redirects light onto one of the kernels, forming a Gaussian caustic through refraction (or reflection). Each micropatch (and thus each Gaussian caustic) contributes a relatively equal amount of light energy to the projected image. Collectively, the surface elements form a two-dimensional (2D) array of (reflective or refractive) micropatches. Each micropatch generates a Gaussian caustic when illuminated, and the elementary caustics sum to form a joint caustic that approximates the input image.

Embodiments described below provide techniques for decomposing the input image into a collection of Gaussian kernels (referred to as Gaussians), for deriving the shape of a micropatches corresponding to each Gaussian, and for arranging the micropatches as a single, highly continuous surface that will project the desired caustic when the surface is illuminated. Further, embodiments of the invention may be used to create a design for a translucent surface amenable to milling (or other manufacturing process). That is, embodiments of the invention provide for physically realizable surfaces designed using the techniques described below. Further still, certain examples below use a refractive surface configured to redirect light to cast a desired set of Gaussians. However, one of ordinarily skill in the art will recognize that embodiments of the invention presented below are in no way limited to refractive surfaces. And further, that the approaches for generating a refractive surface to cast a set of anisotropic Gaussian kernels may be adapted to design a reflective surface with a collection of mirrors that will cast the same set of set of anisotropic Gaussian kernels in order to approximate an input image.

In the following, reference is made to embodiments of the invention. However, the invention is not limited to specific described embodiments. Instead, any combination of the following features and elements, whether related to different embodiments or not, is contemplated to implement and practice the invention. Furthermore, although embodiments of the invention may achieve advantages over other possible solutions and/or over the prior art, whether or not a particular advantage is achieved by a given embodiment is not limiting of the invention. Thus, the following aspects, features, embodiments and advantages are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

Aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code embodied thereon.

The computer readable medium may be a computer readable signal medium or a computer readable storage medium. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium includes a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain or store a program for use by or in connection with an instruction execution system, apparatus or device.

The flowchart and block diagrams in the Figures illustrate the architecture, functionality and operation of possible implementations of systems, methods and computer program products according to various embodiments of the present invention. In this regard, each block in the flowchart or block diagrams may represent a module, segment or portion of code, which comprises one or more executable instructions for implementing the specified logical function(s). In some alternative implementations the functions noted in the block may occur out of the order noted in the figures. For example, two blocks shown in succession may, in fact, be executed substantially concurrently, or the blocks may sometimes be executed in the reverse order, depending upon the functionality involved. Each block of the block diagrams and/or flowchart illustrations, and combinations of blocks in the block diagrams and/or flowchart illustrations can be implemented by special-purpose hardware-based systems that perform the specified functions or acts, or combinations of special purpose hardware and computer instructions.

Further, embodiments are generally described herein relative to a physical surfaces configured to refract light to recreate an input image. However, one of ordinary skill in the art will recognize that embodiments of the invention may be adapted to create a reflective array of micropatches which recreate which approximate an input image using a collection an anisotropic Gaussian caustics reflected by the respective micropatches.

Figure 1A:
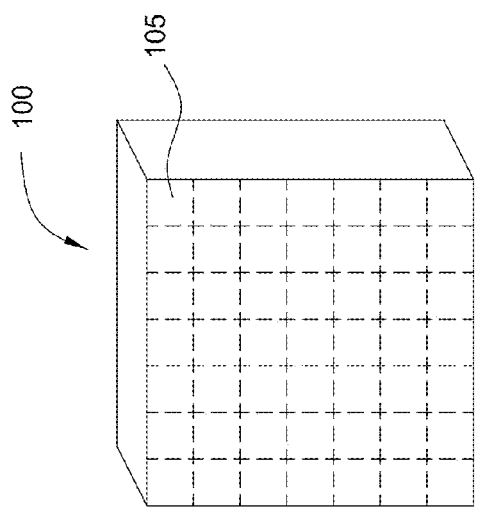
FIG. 1A is a block diagram illustrating a refractive surface configured to project a desired image from multiple caustics, according to one embodiment of the invention.

FIG. 1A is a block diagram illustrating a refractive surface 100 configured to project a desired image as the sum of multiple caustics, according to one embodiment of the invention. In this example, refractive surface 100 represents a transparent acrylic block with a generally flat rear face and a milled front face. The milled front face includes an array of micropatches 105.

Each micropatch 105 provides a lens configured to redirect light passing through the refractive surface 100, resulting in a set of Gaussian caustics being cast on a projection surface. In one embodiment, the refractive surface 100 includes an array of 32×32 micropatches 105 (resulting in a refractive surface 100 which creates 1024 Gaussian caustics on a projection surface). However, the refractive surface 100 may have more (or fewer) micropatches 105 and the number of micropatches in one dimension need not be equal to the number of micropatches in the other dimension. Further, in this example, micropatches 105 are each relatively the same size. Doing so results in micropatches 105 that cast (and therefore each Gaussian caustic receiving) a relatively equal amount of light energy. That is, when lit by direct light (e.g., sunlight) each micropatch 105 generally receives the same amount of light energy from a common light source. As described in greater detail below, configuring each micropatch 105 to cast an equal amount of light energy facilities decomposing an input image into a collection of Gaussians kernels and in designing the shape of each lens (i.e., each micropatch), as well as facilitates assembling the resulting micropatches into a generally continuous (and therefore millable) surface.

FIG. 1B is a block diagram illustrating an example of an image created as a result of light being redirected by the surface 100, according to one embodiment of the invention. As shown, light passing through the refractive surface 100 casts a recognizable image 110 on a projection surface 115. More specifically, the image 110 is composed from a set of Gaussian caustics, each created by light being refracted by one of the micropatches 105 of the surface 100. In this particular example, the Gaussian caustics sum to approximate a well-known image of a woman wearing a hat looking back over her shoulder (referred to as the "Lena image").

Figure 2:
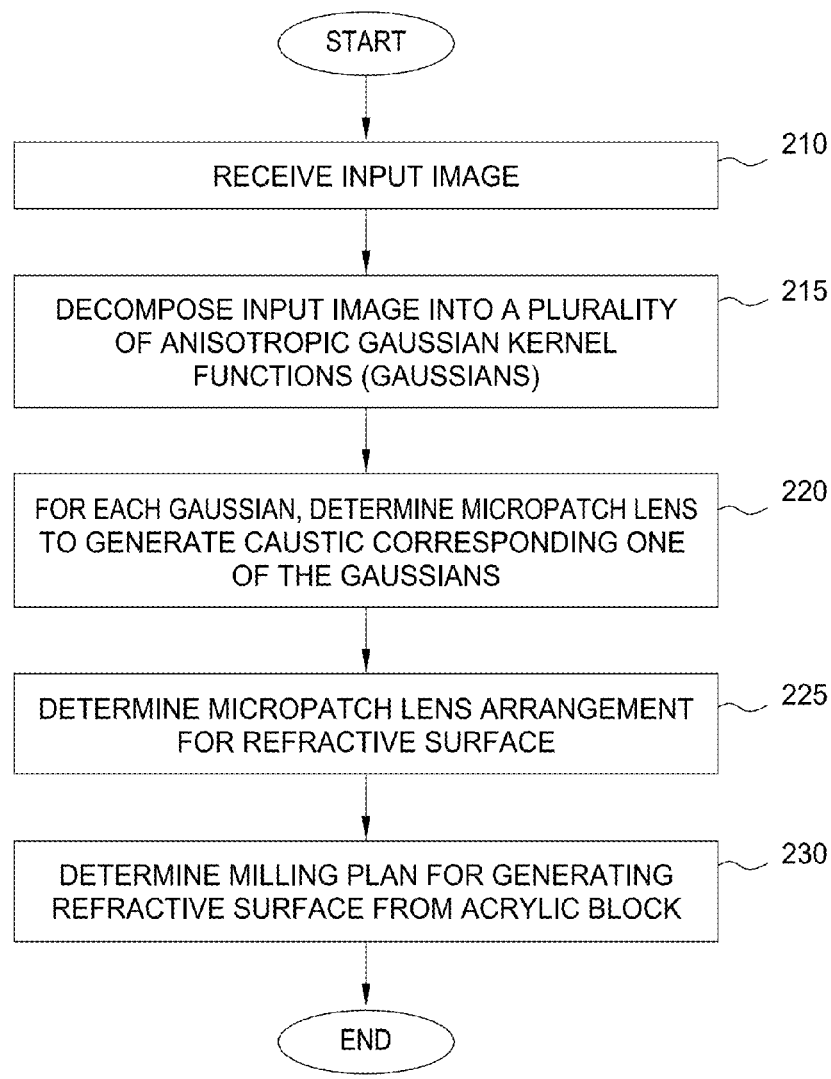
FIG. 2 illustrates a method for designing a surface configured to approximate an input image as a sum of Gaussian caustics, according to one embodiment of the invention.

FIG. 2 illustrates a method for designing a surface configured to approximate an input image as a sum of Gaussian caustics, according to one embodiment of the invention. As shown, the method 200 begins at step 210 where an input image is identified. The input image may be a photograph scanned by an optical scanner into a digital format or an original digital image. In either case, the digital image may be formatted according to a variety of widely used image formats (e.g., a jpg, bitmap, png, gif, etc.).

At step 215, the input image is decomposed into a plurality of anisotropic Gaussian kernel functions. More specifically, in one embodiment, the input image is approximated using a nonnegative linear combination of anisotropic Gaussian kernel functions (referred to as a Gaussian mixture model (GMM)). In context of this disclosure, the parameters to be computed for the GMM include a set of weights $w_i$, means $m_i$ and covariance matrices $S_i$ of a 2-dimensional m-term GMM of the following form:

$$f(x) = \sum_{i=0}^{m} \frac{w_i}{2\pi\sqrt{\det \Sigma_i}} \exp\left(-\frac{1}{2}(x-\mu_i)^T \Sigma_i^{-1}(x-\mu_i)\right) \quad (1)$$

Each of the summands in Equation (1) corresponds to a micropatch on the milled surface. That is, each summand defines an anisotropic Gaussian ellipsoid to be reproduced as a caustic by light redirected by a micropatch on the milled surface. As noted, to facilitate the manufacturing process, each micropatch may be required to collect an equal amount of energy, as doing so allows each micropatch to be manufactured with the same size. In the above equation, this constraint translates into the following:

$$w_i := \frac{1}{m}(i=1, \ldots, m) \quad (2)$$

where m equals the number of micropatches in the surface being designed (and, accordingly, the resulting number of Gaussian kernel functions).

In one embodiment, instead of directly operating on the input image to derive the GMM of Gaussian kernel functions, a dense point representation is first generated from the input image. The dense point representation may be obtained by sampling a large number of points (n) in the input image proportional to pixel luminances. While the number of points (n) may be set as a matter of preference, using n=4,000,000 has proven to be effective, as it is several orders of magnitude larger than the number of micropatches (m) present in a refractive surface configured with a 32×32 grid of micropatches (m) (i.e., where m=1024).

Once generated, the point representation is used to create an initial estimate of the Gaussian functions. Such an estimate may provide a set of isotropic Gaussian functions iteratively refined using a modified Expectation Maximization (EM) algorithm, resulting in the anisotropic Gaussian functions defined by Equation 1, above. Note that while EM will converge to a solution, it generally finds only a locally optimal solution to Equation (1). Hence, it is important to start with a reasonable initial parameter estimate for the GMM to supply to the modified EM algorithm. While a variety of approaches may be used to compute such an initial estimate of the Gaussian functions in the GMM may be employed, using regular point sets that adapt to measurements of image intensity has proven to provide reliable results.

One approach for creating such a point set is to compute a Capacity-Constrained Voronoi Tessellation (CCVT) from the dense point representation. Following that, the centroid of each Voronoi region is chosen as the center of a Gaussian in the initial estimate. Initially, Gaussian kernels are centered at the at eth center of a respective Voronoi region and initialized to an isotropic covariance $\Sigma_i = \text{diag}(\sigma^2; \sigma^2)$, with σ set to the radius of a k-nearest neighbor query across sample points $x_1$ near its center, and with k equal to the capacity of the associated Voronoi region. This approach leads to a similar weighted contribution of samples to each Gaussian's Voronoi region. Additional examples of computing Capacity-Constrained Voronoi Tessellations are described in Balzer M., Schlsomer T., Deussen O: Capacity constrained point distributions: A variant of Lloyd's method, ACM Trans. Graph. (Proc. SIGGRAPH) 28, 3 (2009), 86:1-8, which is hereby incorporated by reference in its entirety.

Once generated, a modified Expectation Maximization (EM) process is used to iteratively refine the initial estimate into the final decomposed set of Gaussian kernel functions used to approximate the input image. The EM algorithm improves the initial estimate using a sequence of alternating expectation and maximization steps. The expectation step computes the probabilities of each sample conditioned on the current set of parameters. The maximization step maximizes an expected log likelihood of the parameters subject to the previously computed probabilities. One known formulation of EM considers all pairs of and sample points. In context of iteratively refining the initial estimate of Gaussians generated by CCVT; however, doing so would lead to prohibitive running times and storage requirements, given the large numbers of Gaussians and samples involved. Accordingly, in one embodiment, pairs with a Euclidean distance that exceed a certain threshold are disregarded. The probability of improving the initial estimate by pairing Gaussians that exceed the threshold are relatively low and approach zero for larger distances. Accordingly, disregarding pairs with a distance that exceed the threshold effectively turns each E and M step into a sparse problem. Further, in one embodiment, a kd-tree may be used to identify relevant pairs of Gaussians. Doing so may speed up the EM convergence from $O(n^2)$ to $O(n \log n)$, assuming m and n to be proportional to each other. In addition, a sparse matrix representation may be used to pass probabilities into the Maximization step, to avoid $O(n^2)$ memory usage. Converting the EM algorithm using the described sparsity optimizations allow a converged solution (i.e., a solution to equation (1), above) to be generated in a reasonable time.

Figure 3A:
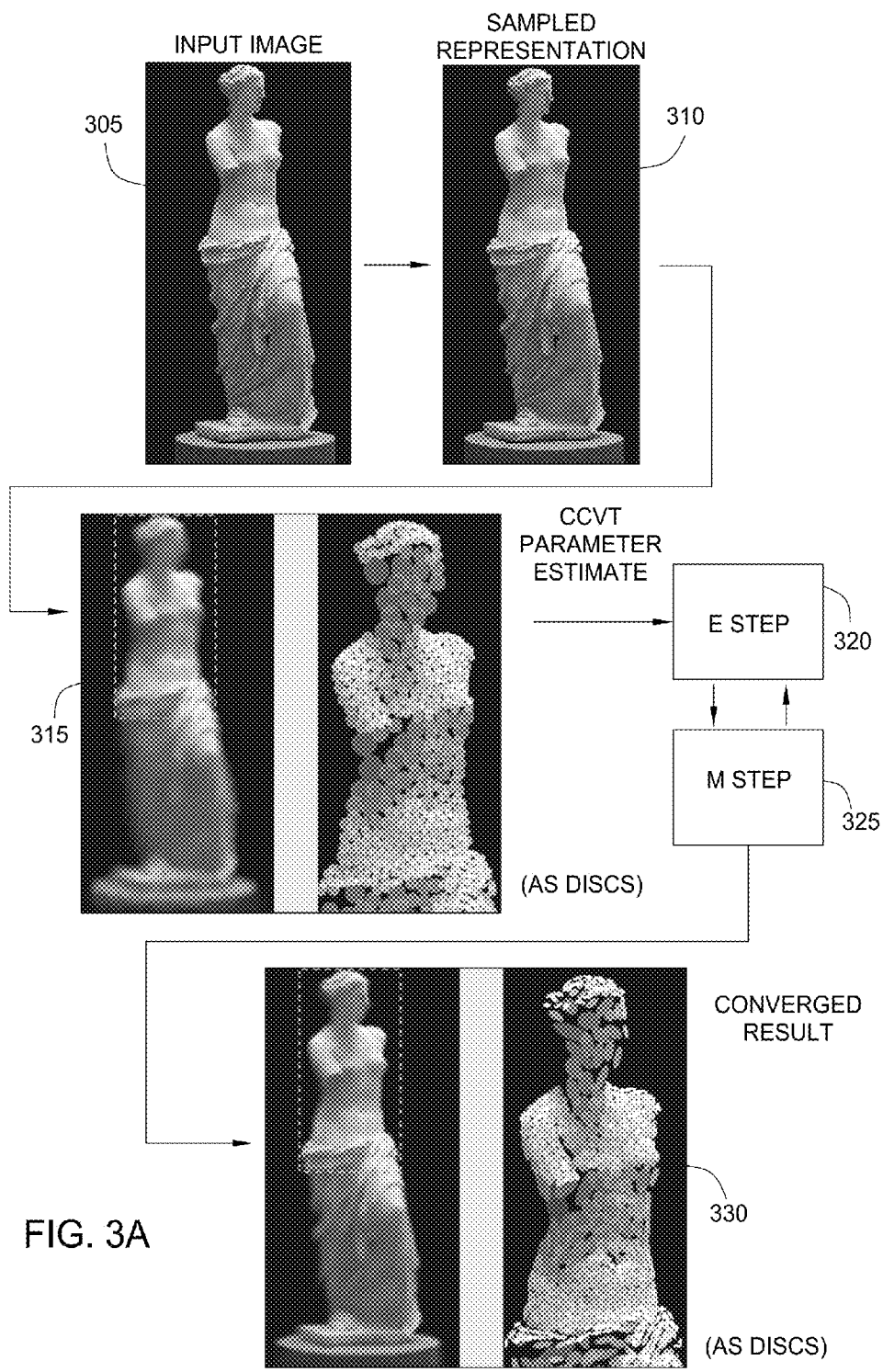
FIGS. 3A-3D illustrate example images decomposed into a plurality of Gaussians, according to one embodiment of the invention.

FIGS. 3A-3D illustrate examples of images decomposed using the approaches described above, according to one embodiment of the invention. First, FIG. 3A illustrates a complete example of the decomposition process performed as part of step 215 of method 200. As shown, an input image 305—in this case an image of the Venus de Milo statue—is processed to create a point sampled representation 310. As noted, the sampling may be dense (e.g., a sample size of n=4,000,000). Each sample provides a sampled pixel luminance for a point in the input image 305. The sampled representation 310 is then tessellated according to the CCVT algorithm to generate a CCVT parameter estimate 315 for a set of Gaussian kernel functions that will approximate the input image. As shown, CCVT parameter estimate 315 shows the upper half of the Venus de Milo statue composed as a series of overlapping discs (i.e., as a collection of isotropic Gaussian Kernels). The resulting CCVT parameter estimate 315 is passed to a modified Expectation Maximization algorithm, where an Expectation step 320 and a Maximization step 325 are iteratively performed to create a converged result 330. The converged result 330 shows the initial estimate of the Gaussians after converging to a collection of ellipsoids approximating the input image (i.e., converging to a set of anisotropic Gaussian Kernels satisfying equation (1), above).

Figure 3B:
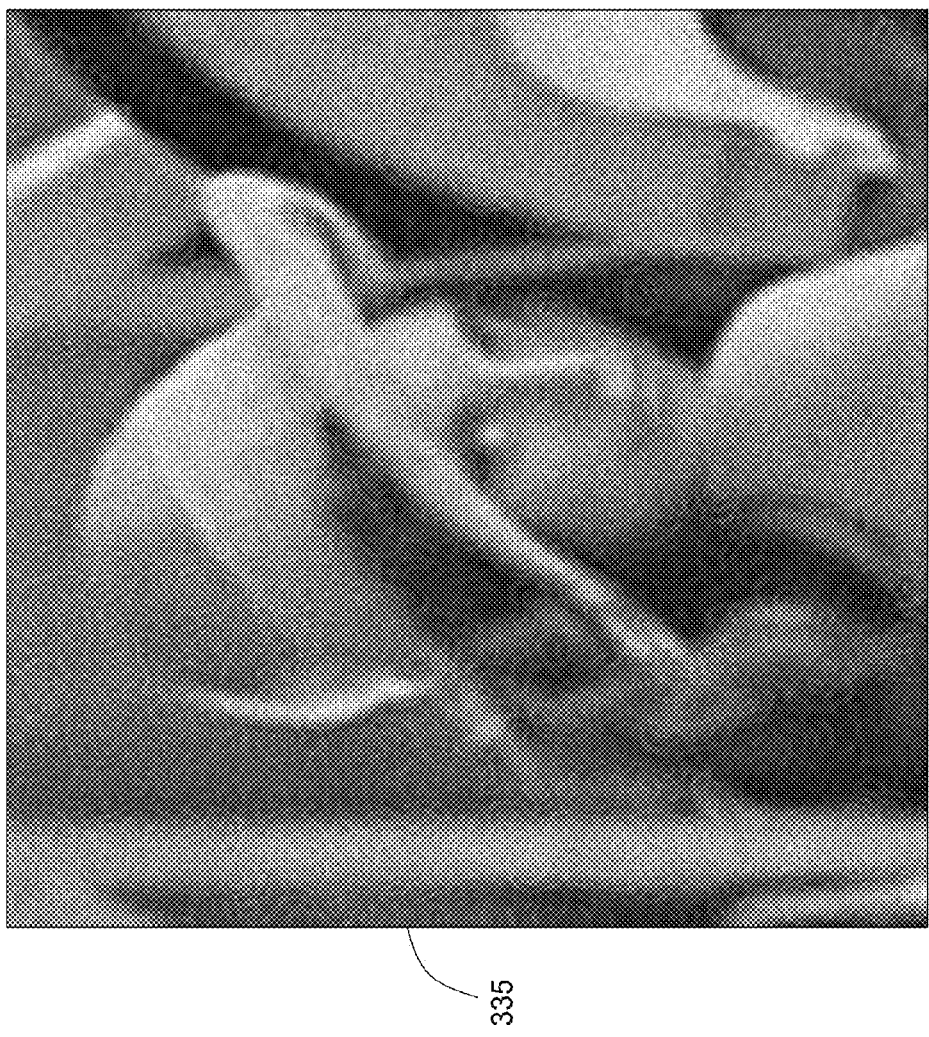
Figure 3C:
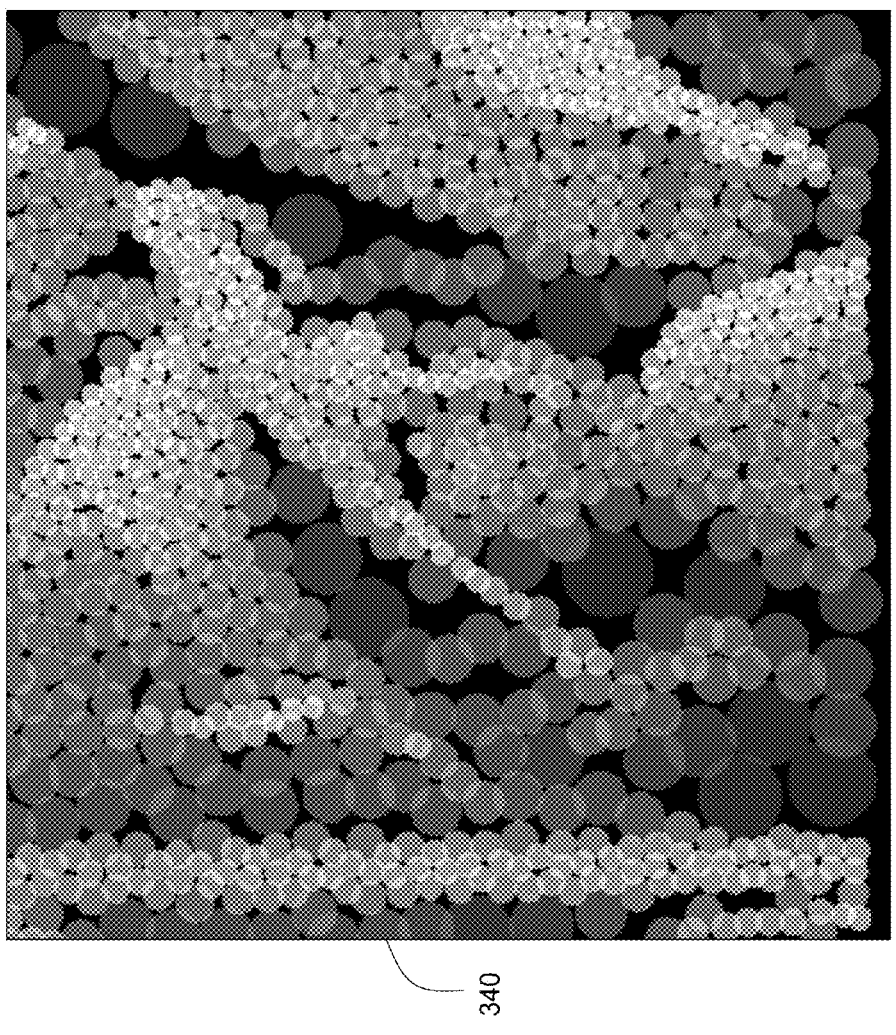
Figure 3D:
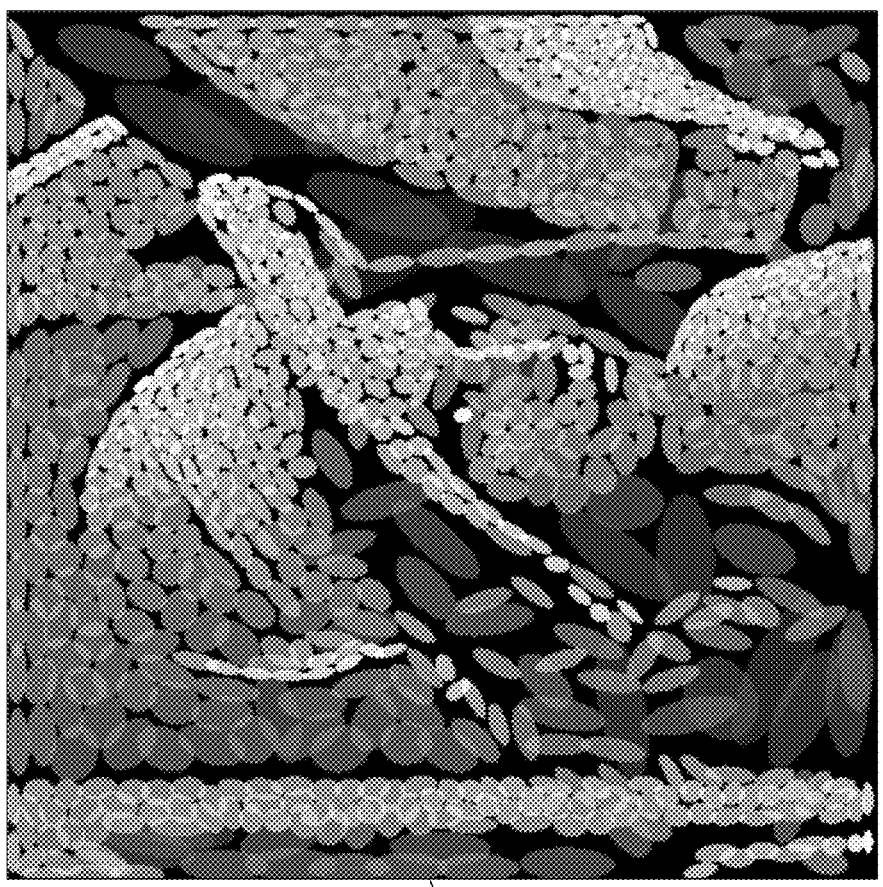

FIG. 3B illustrates another example of dense point representation of an input image. In this case, a dense point representation 335 of the well-known Lena image. Again, from the dense point representation 335 an initial estimate of a set of Gaussian kernels may be created by tessellating the dense point representation 335 using a CCVT algorithm. This result is shown in FIG. 3C. Specifically, FIG. 3C illustrates an overlapping set of isotropic Gaussian kernel functions providing an initial approximation 340 of the Lena image. Note, each Gaussian kernel function distributes the same amount of energy to the image approximation. Thus, larger Gaussians are dimmer, while smaller Gaussians are brighter. As noted, the initial estimates of the Gaussians may be iteratively refined using a modified Expectation Maximization algorithm. This result is shown in FIG. 3D. Specifically, FIG. 3D illustrates an approximation 345 of the Lena image after performing two hundred and eighty-five iterations of the Expectation Maximization algorithm. The resulting overlapping set of anisotropic Gaussian kernel functions provides a final approximation of the original input image. Like the initial estimate of the Gaussians shown in FIG. 3C, each of the anisotropic Gaussian kernel functions in FIG. 3D distributes the same amount of energy to the final image approximation 345, but the size, orientation, and eccentricity of each Gaussian kernel has evolved to better approximate the input image.

Referring again to the method 200, once the image decomposition process of step 215 has been completed, at step 220, a shape for a micropatch lens corresponding to each Gaussian kernel function is determined. Each micropatch lens is configured to redirect light in order to cast one of the Gaussians on a projection surface. In the reflective case, the micropatch provides a small concave reflector. In the refractive case, the micropatch provides a plano-convex micro-lens. FIG. 4A illustrates an example of a refractive micropatch, according to one embodiment of the invention. As shown, light rays emanating from a light source 405 intersect the back side of a milled surface 410, which refracts the light through micropatch 415 casting an anisotropic Gaussian kernel on projection surface 425. That is, the light energy refracted by micropatch 415 creates a Gaussian caustic 420 projection on the projection surface 425. The Gaussian caustic 420 distributes light energy in an ellipsoid pattern according to a Gaussian distribution corresponding to one of the Gaussian kernel functions generated at step 215.

In one embodiment, the surface of micropatch 415 may be determined first by determining a field of surface normals corresponding to the micropatch and then integrating the resulting normal field to derive the shape for a micropatch surface. This process is shown in FIG. 4B. That is, FIG. 4B illustrates a process for determining a lens shape configured to generate an anisotropic Gaussian caustic on a projection surface, according to one embodiment of the invention.

Illustratively, FIG. 4B shows a projection plane 425 as being parallel to the micropatch 415 (at z=−D). However, the approach described herein may be adapted for a 2D domain on an arbitrary curved projection surface. As shown, the surfaces are oriented to have the milled side facing the projection plane and the flat side facing the light. For simplicity of exposition, assume distant illumination coming from the z+ direction, allowing the first refraction, (on the un-milled side of the surface) to be ignored. However, local light sources and refractions may be accounted for at both interfaces, e.g., by solving for the first refraction point as done by Walter B., Zhao S., Holzschuch N., Bala K.: Single scattering in refractive media with triangle mesh boundaries, ACM Transactions on Graphics 28, 3 (August, 2009), hereby incorporated by reference in its entirety.

Similarly, the projection plane 425 may be positioned at an angle relative to the micropatch 415. In such a case, the ellipsoid corresponding to a Gaussian Kernel function may be translated to account for the relative angle between the projection plane 425 and the micropatch 415. FIG. 4B also shows a mapping between points in the micropatch domain and points on the projection plane 425 such that the irradiance distribution follows a Gaussian profile (box 400). That is, the mapping between points on the micropatch domain and corresponding points on the projection surface such that an intensity of light energy distributed by the mapping corresponds to one of the Gaussian kernel functions. Once this mapping is defined, surface normals that refract (or reflect) light in this way may be computed (box 401). This resulting normal field is then integrated to derive the micropatch surface (box 402).

To compute the surface normal of the micropatch 415, a mapping between points on the micropatch, g, and the corresponding points, p, on the projection plane needs to be determined. Further, to enforce the requirement that the resulting irradiance profile is a 2D Gaussian, the determinant of the Jacobian of the mapping itself needs to be a 2D Gaussian. Given this continuous correspondence, the normal direction producing the required refraction direction at any point of the micropatch may be solved for analytically, and a discretized version of this normal field may then be integrated to obtain the elevated micropatch surface.

Figure 4C:
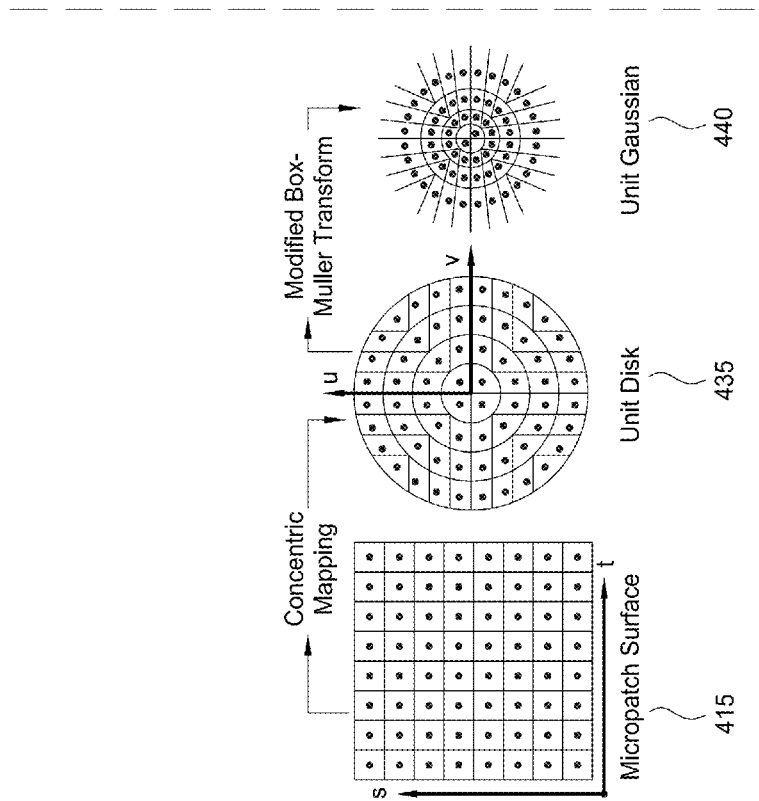
FIG. 4C illustrates a multi-stage process of mapping points in the micropatch domain to points on a Gaussian caustic, according to one embodiment of the invention.

In one embodiment, to compute the surface normals of the micropatch 415, a mapping from points in the micropatch to a zero-mean unit Gaussian at the projection plane q is found. In an embodiment where micropatches are square, points of the micropatch 415 can be parameterized as $g(s, t)=[g_x, g_y, g_z]^T$ where $(s, t) \in [0, 1]^2$. In one embodiment, a two-stage transformation process is used to transform the square shape of a micropatch into points on Gaussian caustic. For example, FIG. 4C illustrates an example of a multi-stage process of mapping points in the micropatch domain (s, t) to points on a Gaussian caustic, according to one embodiment of the invention.

As shown, a low-distortion concentric mapping may be applied to map points (s, t) in the square micropatch surface 415 to points (u, v) on a unit disk. For example, one approach for such a mapping is described in Shirley P., Chiu K.: A low distortion map between disk and square, Journal of Graphics Tools 2, 3 (1997), 45-52, which is hereby incorporated by reference in its entirety. Of course, other approaches could be used as well. Once points the micropatch surface 415 are mapped to a unit disk 435, a Box-Muller transform may be applied to map points on the on the micropatch to points on a unit Gaussian 440. This two step approach ensures a "well behaved" mapping, i.e., one that is continuous, low-distortion, and without singularities to ensure the resulting normal field may be successfully integrated. That is, by mapping points on the micropatch surface 415 to the unit disk 435, the Box-Muller transform non-uniformly scales the radius without creating any singularities. The Concentric Mapping provides a disk and the Box-Muller transform is applied on points within the disc, which scales, non-uniformly, the distance to the center to warp disk points into a Gaussian. The Given the point (u, v) in the unit disk 435, the new radius may be computed as:

$$R = \sqrt{\frac{-2\log(1 - u^2 - v^2)}{u^2 + v^2}} \quad (3)$$

The resulting point on a unit Gaussian is $q=[uR, vR]^T$.

Once the mapping between points on the micropatch surface 415 (s, t) to points on the Gaussian caustic is determined, the unit Gaussian position q is transformed to obey a specific mean μ and covariance matrix Σ. Known approaches for doing this are typically only concerned with properly transforming the distribution, e.g., by interpreting the coordinates as offsets along the scaled eigenvectors of the covariance matrix Σ, resulting in a sequence of scale, rotation and translation operations. However, this may result in large distortions in the mapping from patch coordinates to the final projection plane positions, affecting the integratability of the normal field. In one embodiment, to prevent such distortions, rotation is eliminated from the transformations. Instead, the point q may be scaled directly along the directions of the eigenvectors of the covariance matrix Σ and then translated by the mean μ. This is equivalent to transforming q by the square root of the covariance matrix (as defined by the matrix logarithm):

$$p = -\sqrt{\Sigma} q + \mu \quad (4)$$

The mapping between a point on the micropatch surface 415 and a corresponding point on the Gaussian caustic is completed by placing this 2D point onto the projection plane 425 as shown FIG. 4B. In one embodiment, this may occur by appending a z-component of $p_z = -D$ to the above result. Note, Equation (4) actually scales by the negative square root, which introduces a reflection about the origin prior to translation. This results in micropatches 415 which focus light (between the micropatch 415 and the projection plane 425) regardless of the size of the Gaussian caustic. Doing so may result in refractive micropatches 415 with greater curvature, which is better for milling.

Figure 4D:
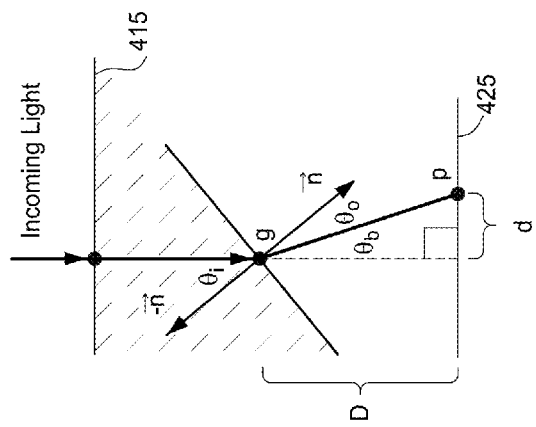
FIG. 4D illustrates graphical representation of a 2D coordinate system, according to one embodiment of the invention.

Given this mapping, the surface normal at each location g which would refract light towards p may be computed. Since the refracted direction, surface normal, and incident direction will lie in the same plane, this may be viewed as a 2D problem within that plane, as illustrated in FIG. 4D. As shown, the angle between the outgoing direction and the incident direction is given by $\theta_b = \arctan(\beta)$, where $$\beta = \frac{d}{D}.$$

Because $\theta_o = \theta_i - \theta_b$, the incident angle may be solved for as:

$$\theta_i = \frac{\arctan(\eta_o \sin(\theta_b))}{\eta_o \cos(\theta_b) - \eta_o} \quad (5)$$

where $\eta_i$ and $\eta_o$ are the incident and outgoing indices of refraction. The surface normal vector is then obtained by rotating the incident vector towards the outgoing vector by $\theta_i$ radians.

Having determined the normal field for a micropatch, the normal field is integrated to derive the actual surface topology for the corresponding micropatch. This process is repeated for each micropatch on the final surface. In one embodiment, e.g., each resulting micropatch may be modeled as a rectilinear grid of elementary microfacets with the desired normal orientations. Doing so allows a Poisson problem to be solved in order to lift each microfacet to a height level in the Z dimension that leads to a near-continuous surface.

Referring again to the method 200, once the image decomposition process (step 215) and the shape of each micropatch has been determined (step 220), the micropatches are assembled to create a highly continuous surface (step 225). That is, given a Gaussian image decomposition, an assembly of micropatches is determined that generates the respective Gaussian caustics, while also resulting in a surface that is as continuous as possible. Doing so facilitates fabrication and also minimizes stray light at boundaries between patches.

In one embodiment, the microfacets are first distributed randomly in the 2D grid of the surface being designed, and then optimized using Simulated Annealing. Further, each micropatch may be approximated using a planar proxy geometry that refracts a central ray toward the center of the target Gaussian. Doing so may be effective as the orientation of such a proxy has proven to be a good approximation of the overall "tilt" of a Gaussian micropatch that projects toward the same center. The planar approximation is then used during optimization to gauge the compatibility of neighboring micropatches. Note this approach follows the height field optimization described in Weyrich T., Peers P., Matusik W., Rusinkiewicz S.: Fabricating microgeometry for custom surface reflectance, ACM Trans. on Graphics (Proc. SIGGRAPH) 28, 3 (2009), 32:1-6, which is hereby incorporated by reference in its entirety (referred to as Weyrich et al.).

As described in Weyrich et al., Simulated Annealing may be used to optimize the permutation of microfacets (which again, provide a proxy for the micropatches). However, other approaches can be used. For example, a simulated perturbation stochastic approximation (SPSA) could be used. However, the simpler Simulated Annealing iteration has proven to produce satisfactory results nevertheless.

In context of this disclosure, the central transition operation performed during Simulated Annealing is the swap of two facets, but in contrast to the case of bidirectional reflectance distribution function (BRDF) design discussed in Weyrich et al., where only the net effect of a microfacet assembly under infinite lighting and viewing is of interest, a swap alters the orientation of the two facets. That is, swapping two mircofacets basically corresponds to swapping the assignment of two kernel centers to their facets, triggering the re-computation of each micofacet's normal The approach for assembling microfacets described in Weyrich minimizes the following: facet compatibility C, tileability I, and the avoidance of valleys V. However, tileability is not required for the planar microfacets and valley avoidance is of reduced value, as the (refractive) micropatches create slight ridges in any case. Thus, only compatibility C is required for the energy function used during Simulated Annealing. Nevertheless, to bias the solution toward more low-frequency solutions, a smoothness term given by $S = S_x + S_y$, may be added to the energy function. In one embodiment, such a smoothness factor may be defined as $$S_x = \sum_y \sum_x \left\| \frac{dz(x, y)}{dx} \right\|^2, \quad (6)$$

with $d_z$ and $S_y$ defined as in Weyrich et al. Including a smoothing factor has proven to lead to surfaces that are easier to polish after the milling process, at least in some cases. The final energy function may then be given as:

$$E = \frac{c + s}{m^2}, \quad (7)$$

As above, C is facet compatibility, S is the smoothing factor, and, m equals the total number of micropatches.

The height field integration to determine facet placements in the z direction may also follow the approach in Weyrich et al. (where as noted, tileability may be ignored). In the present context however, changing the height level of a microfacet requires re-aiming it at its caustic center. To address this issue, in one embodiment, multiple iterations of height field optimization and normal re-computation as described in Weyrich et al. may be performed. That is, multiple cycles of the height field simulation, followed by the Simulated Annealing optimization are performed. In one embodiment, three optimization cycles are performed, as reliable convergence has proven to occur after the second iteration. After this, each microfacet is replaced with the corresponding micropatch, leading to near-continuous surfaces assembled from the plurality of micropatches.

Referring again to the method 200, at step 230, a milling plan for realizing the refractive surface is generated. The milling plan may be tailored for use with any suitable milling device used to physically realize a refractive surface using the approaches described above. However, one of ordinary skill in the art will recognize that in addition to milling processes any other suitable other manufacturing approaches may be used to realize the refractive surface. For example, while a milling device may be used to create the refractive surface from a solid acrylic block, as an alternative to cutting away a surface, a three dimensional printer could be used to build up a transparent refractive surface with the plurality of micropatches having the characteristics described above. Similarly, for realizing a reflective surface, any suitable manufacturing approach may be used.

Figure 5:
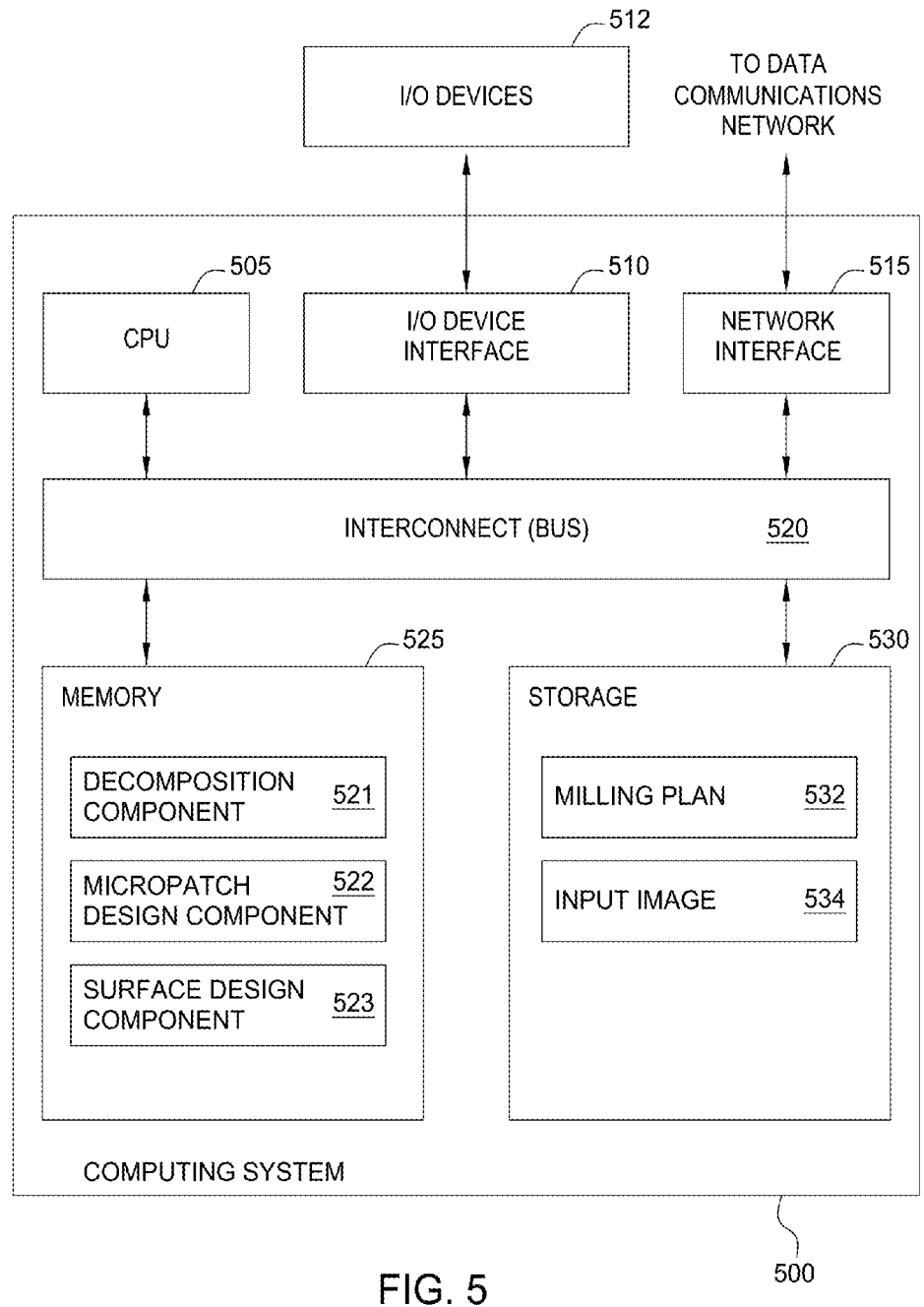
FIG. 5 illustrates an example computing system configured to derive a refractive (or reflective) surface from an input image, where the surface is configured to project (or reflect) a desired image composed from a plurality of anisotropic Gaussian caustics, according to one embodiment of the invention.

FIG. 5 illustrates an example computing system 500 configured to derive a refractive (or reflective) surface configured to approximate a desired input image composed from a plurality of anisotropic Gaussian caustics, according to one embodiment of the invention. As shown, the computing system 500 includes, without limitation, a central processing unit (CPU) 505, a network interface 515, an interconnect 520, a memory 525, and storage 530. The computing system 500 may also include an I/O device interface 510 connecting I/O devices 512 (e.g., keyboard, display and mouse devices) to the computing system 500.

The CPU 505 retrieves and executes programming instructions stored in the memory 525. Similarly, the CPU 505 stores and retrieves application data residing in the memory 525. The interconnect 520 facilitates transmission, such as of programming instructions and application data, between the CPU 505, I/O devices interface 510, storage 530, network interface 515, and memory 525. CPU 505 is included to be representative of a single CPU, multiple CPUs, a single CPU having multiple processing cores, and the like. And the memory 525 is generally included to be representative of a random access memory. The storage 530 may be a disk drive storage device. Although shown as a single unit, the storage 530 may be a combination of fixed and/or removable storage devices, such as fixed disc drives, floppy disc drives, tape drives, removable memory cards, or optical storage, network attached storage (NAS), or a storage area-network (SAN).

Illustratively, the memory 525 includes decomposition component 521, a micropatch design component 522 and a surface assembly component 523. And the storage 530 includes a milling plan and 532 and an input image 534. In one embodiment, the decomposition component 521 provides a software component configured to retrieve the input image 534 and generate the Gaussian kernel functions, as described above. The micropatch design component 522 uses the Gaussian kernel functions to derive a micropatch surface for each Gaussian that will cast a Gaussian caustic, the sum of which approximates the input image 534. Once the micropatch surfaces have been determined, the surface design component 523 may determine a smooth, highly-continuous surface. Further, the surface design component 523 may be configured to generate a milling 532 used to physically realize a refractive surface that will approximate the input image.

Advantageously, as described above, a refractive surface may be designed to produce a desired caustic when illuminated by a light source. Similarly, a reflective surface may be designed which will produce a desired caustic when illuminated by a light source. Using anisotropic Gaussian kernels provides a robust approach for generating complex caustics to approximate a variety of images. Further, the non-negative image decomposition process scales well to very large numbers of Gaussian kernels, allowing highly intricate caustic designs. At the same time, the anisotropic Gaussian primitives are flexible enough to describe a wide range of natural image content even with only moderate numbers of kernels, making it possible to fabricate physically refractive surfaces using off-the-shelf hardware.

While the foregoing is directed to embodiments of the present invention, other and further embodiments of the invention may be devised without departing from the basic scope thereof, and the scope thereof is determined by the claims that follow.

What is claimed is:

1. A method for designing a light-redirecting surface, comprising:
   decomposing, using a computer, an input image into a plurality of Gaussian kernel functions, wherein the decomposing comprises:
      generating a dense point sampling representation of the input image,
      tessellating the input image to create an initial estimate of the plurality of Gaussian kernel functions, wherein the initial estimate provides a plurality of isotropic Gaussian functions, and
      evolving the initial estimate of the plurality of the Gaussian kernel functions using Expectation Maximization to derive a plurality of anisotropic Gaussian kernel functions representing the approximation of the input image;
   for each of a plurality of micropatch lenses on the light-redirecting surface being designed:
      determining a mapping between a plurality of points on a micropatch domain and corresponding points on a projection surface such that an intensity of light energy distributed by the mapping corresponds to one of the Gaussian kernel functions, and
      determining, from the mapping, a surface topology for a micropatch lens that will cast a Gaussian caustic corresponding to one of the Gaussian kernel functions; and
      determining an arrangement of the micropatch lenses on the light-redirecting surface, wherein the Gaussian caustics cast by the plurality of arranged micropatch lenses sum to form an approximation of the input image.

2. The method of claim 1, wherein each Gaussian caustic distributes a same amount of light energy.

3. The method of claim 1, wherein the arrangement of the plurality of micropatch lenses on the light-redirecting surface is determined to provide a light-redirecting surface.

4. The method of claim 1, wherein one or more of the Gaussian caustics are an anisotropic Gaussian caustic.

5. The method of claim 1, wherein the plurality of micropatch lenses are configured to either refract light or reflect light in order to create the respective Gaussian caustics.

6. The method of claim 1, wherein determining, from the mapping, a surface topology for the plurality of micropatch lenses comprises:
   for each micropatch lens:
      determining a normal field for a surface that will refract light corresponding to the Gaussian kernel function, and
      integrating the normal field to determine a surface topology for the micropatch surface.

7. A non-transitory computer readable storage medium storing one or more applications, which, when executed on a processor, perform operations for designing a light-redirecting surface, the operations comprising:
   decomposing an input image into a plurality of Gaussian kernel functions, wherein the decomposing comprises:
      generating a dense point sampling representation of the input image,
      tessellating the input image to create an initial estimate of the plurality of Gaussian kernel functions, wherein the initial estimate provides a plurality of isotropic Gaussian functions, and
      evolving the initial estimate of the plurality of the Gaussian kernel functions using Expectation Maximization to derive a plurality of anisotropic Gaussian kernel functions representing the approximation of the input image;
   for each of a plurality of micropatch lenses on the light-redirecting surface being designed:
      determining a mapping between a plurality of points on a micropatch domain and corresponding points on a projection surface such that an intensity of light energy distributed by the mapping corresponds to one of the Gaussian kernel functions, and
      determining, from the mapping, a surface topology for a micropatch lens that will cast a Gaussian caustic corresponding to one of the Gaussian kernel functions; and
   determining an arrangement of the micropatch lenses on the light-redirecting surface, wherein the Gaussian caustics cast by the plurality of arranged micropatch lenses sum to form an approximation of the input image.

8. The non-transitory computer readable storage medium of claim 7, wherein each Gaussian caustic distributes a same amount of light energy.

9. The non-transitory computer readable storage medium of claim 7, wherein the arrangement of the plurality of micropatch lenses on the light-redirecting surface is determined to provide a light-redirecting surface.

10. The non-transitory computer readable storage medium of claim 7, wherein one or more of the Gaussian caustics are an anisotropic Gaussian caustic.

11. The non-transitory computer readable storage medium of claim 7, wherein the plurality of micropatch lenses are configured to either refract light or reflect light in order to create the respective Gaussian caustics.

12. The non-transitory computer readable storage medium of claim 7, wherein determining, from the mapping, a surface topology for the plurality of micropatch lenses comprises:
   for each micropatch lens: determining a normal field for a surface that will refract light corresponding to the Gaussian kernel function, and
   integrating the normal field to determine a surface topology for the micropatch surface.

* * * * *